United States Patent [19]

Nishitani

[11] Patent Number: 4,961,012
[45] Date of Patent: Oct. 2, 1990

[54] SEMICONDUCTOR INTEGRATED CIRCUIT DEVICE RESPONSIVE TO CLOCK SIGNALS HAVING DIFFERENT AMPLITUDES

[75] Inventor: Kazuharu Nishitani, Hyogo, Japan

[73] Assignee: Mitsubishi Denki Kabushiki Kaisha, Tokyo, Japan

[21] Appl. No.: 302,033

[22] Filed: Jan. 26, 1989

[30] Foreign Application Priority Data

Feb. 8, 1988 [JP] Japan .................................. 63-26900

[51] Int. Cl.⁵ .............................................. G06F 7/38
[52] U.S. Cl. .................................... 307/465; 307/468; 307/481; 328/155
[58] Field of Search ........ 307/465, 268, 481, 264–265, 307/465–468, 362; 328/155, 58

[56] References Cited

U.S. PATENT DOCUMENTS

| | | | |
|---|---|---|---|
| 3,603,816 | 9/1971 | Podara | 307/481 |
| 4,038,605 | 7/1977 | Elder et al. | 307/362 |
| 4,330,751 | 8/1982 | Swain | 307/265 |
| 4,386,281 | 5/1983 | Terry | 307/594 |
| 4,414,512 | 11/1983 | Nelson | 307/362 |
| 4,496,855 | 1/1985 | Yamamura | 307/362 |
| 4,691,382 | 9/1987 | Nakajima | 307/265 |
| 4,692,635 | 9/1987 | Rapp | 307/279 |
| 4,719,369 | 1/1988 | Asano et al. | 307/443 |
| 4,757,217 | 7/1988 | Saweda et al. | 307/481 |
| 4,786,829 | 11/1988 | Letcher | 307/465 |
| 4,808,937 | 2/1989 | Correa et al. | 307/269 |
| 4,812,678 | 3/1989 | Abe | 307/443 |

OTHER PUBLICATIONS

CMOS Standard Cell Design Manual (MN72000 series), Matsushita Electronics Corporation, Handoutai Gigyou Honbu, 1986, p. 16.

Primary Examiner—Stanley D. Miller
Assistant Examiner—T. Cunningham
Attorney, Agent, or Firm—Lowe, Price, Leblanc, Becker & Shur

[57] ABSTRACT

A buffer 6 operating in response to an amplitude level of a clock signal is provided in a semiconductor integrated circuit device such as, a gate array. By selectively applying clock signals of different amplitude corresponding to operation modes, the buffer 6 operates selectively. Therefore, for example, the designation of a test mode can be detected by the buffer 6. As a result, it is not necessary to provide a terminal for externally receiving a test mode signal.

9 Claims, 5 Drawing Sheets

SEMICONDUCTOR INTEGRATED CIRCUIT DEVICE RESPONSIVE TO CLOCK SIGNALS HAVING DIFFERENT AMPLITUDES

BACKGROUND OF THE INVENTION

1. Field of the Invention

The present invention generally relates to a semiconductor integrated circuit device and, more particularly, to a semiconductor integrated circuit device comprising a circuit operating in response to two clock signals having amplitudes of different voltage levels The present invention has particular applicability for a semiconductor integrated circuit device, for example, such as a gate array in which the number of terminals for externally receiving control signals is restricted.

2. Description of the Background Art

Generally, the number of I/O pins or terminals of an IC package housing a semiconductor integrated circuit (hereinafter referred to as an IC), for example such as a gate array is determined by a standard, corresponding to the size of the IC package. More specifically, for example, an IC package having 64 pins is standardized and an IC package having 80 pins is provided as an IC package having more pins than the number of 64. Therefore, for example, when 65 pins are required by an IC housed in a package, an IC package having 80 pins has to be used. As a result, the size of the IC package to be used becomes big, which is not preferable. Particularly, it is not preferable that the size of an IC package becomes big in order to provide a pin for inputting a control signal which is necessary only when the IC is tested.

FIG. 1 is a circuit diagram showing an example of an IC having a conventional selector circuit for testing. This selector circuit is found, for example, on page 16 in a CMOS standard cell design manual (MN72000 series) of Matsushita Electronics Corporation in 1986.

Referring to FIG. 1, the IC comprises two 8-bit ripple counters 1 and 2 for constituting a dividing circuit, a selector circuit 3 connected between the ripple counters 1 and 2 and an inner circuit 7 connected to receive output signals from the ripple counters 1 and 2. The ripple counter 1 is connected such that a toggle input T may receive a clock signal $\phi 3$ from the outside through a buffer 11 and also connected such that a reset input R may receive a reset signal RST from the outside through a buffer 12. The selector circuit 3 has one input connected to the output of the ripple counter 1 and the other input connected to receive the clock signal $\phi 3$ through the buffer 11. The ripple counter 2 has the toggle input connected to the output of the selector circuit 3 and the reset input R connected to receive the reset signal RST through the buffer 12. The inner circuit 7 is connected to receive the output signals of the ripple counter 1 and 2. The inner circuit 7 performs predetermined digital signal processing in response to the output signals from the counters 1 and 2. The output signals of the counters 1 and 2 are outputted to the outside through the buffers 13 and 14, respectively. The selector circuit 3 is connected to receive a test mode signal TM from the outside through a buffer 5. The selector circuit 3 comprises two AND gates 31 and 32, an OR gate 34 and an inverter 33.

In operation in the common mode, the test mode signal TM at a low level is externally applied to the selector circuit through the buffer 5. The selector circuit 3 connects an output Q of the ripple counter 1 to the toggle input T of the counter 2 in response to the signal T. As a result, a 16-bit counter is constituted by the counters 1 and 2. The inner circuit 7 performs a predetermined operation in response to the output signals from these two counters 1 and 2.

On the other hand, in operation in the test mode, the test mode TM at a high level is applied to the selector circuit 3. The selector circuit 3 is connected to the toggle input T of the ripple counter 2 to receive the clock signal $\phi 3$ in response to the signal TM. As a result, the clock signal $\phi 3$ is applied to the toggle input of each of the ripple counters 1 and 2 from the outside. Normal operation of the ripple counters 1 and 2 are recognized by confirming that the output levels of the counters 1 and 2 change every 128th clock of the clock signal $\phi 3$.

The select circuit 3 is provided for shortening time required for confirming the operation of the counters 1 and 2. More specifically, if the selector circuit 3 is omitted, it means that the output Q of the counter 1 is directly connected to the toggle input T of the counter 2. In this case, when a test for confirming the operation of the two counters 1 and 2 is performed, the clock signal $\phi 3$ of 32,768, $(=2^8 \times 2^7)$ clocks is required, which requires a long testing time.

Although the selector circuit 3 is provided for shortening the testing time, a terminal for externally receiving the signal TM to control the circuit 3 is required. However, it is not preferable to provide a pin or a terminal only for the operation in the test mode as described above and there is a problem in which a big IC package has to be used to provide a terminal for receiving the signal TM.

SUMMARY OF THE INVENTION

An object of the present invention is to provide a semiconductor integration circuit device having a circuit operating in response to a clock signal in which the number of input terminals for receiving external control signals is reduced.

Another object of the present invention is to provide a semiconductor integrated circuit device having a circuit operating in response to a clock signal in which a terminal for externally receiving a signal to indicate the test mode is eliminated.

A further object of the present invention is to provide a gate array device having a circuit operating in response to a clock signal in which the number of input terminals for receiving external control signals is reduced.

Still another object of the present invention is to provide a gate array device having a circuit operating in response to a clock signal in which a terminal for externally receiving a signal to indicate the test mode is eliminated.

In brief, the present invention comprises clock signal receiving means for receiving either a first clock signal having an amplitude of a first voltage level or a second clock signal having an amplitude of a second voltage level lower than the first voltage level, a first circuit operating in response to the first or second clock signal, a switching circuit connected between the clock signal receiving means and the first circuit, a detection circuit detecting a voltage level of an amplitude of a signal applied to the clock signal receiving means, and a control signal generation circuit generating a signal for controlling the switching circuit in response to the detection circuit.

In operation, the switching circuit is controlled in response to an amplitude level of the externally applied clock signal. Therefore, it is not necessary to provide a terminal for externally receiving a signal to control the switching circuit.

In a preferred embodiment, the detection circuit comprises a buffer circuit having a threshold voltage at a level between the first voltage level and the second voltage level. Therefore, by using the buffer circuit having the controlled threshold voltage, the amplitude level of the clock signal can be easily detected.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
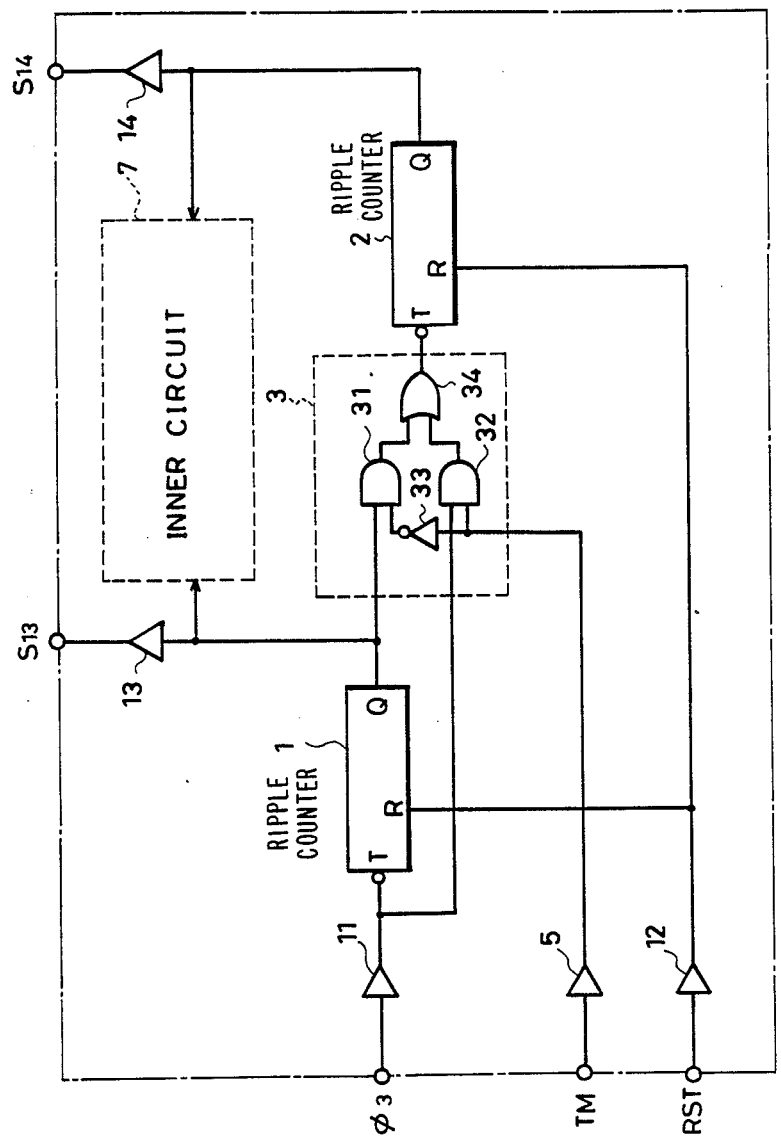
FIG. 1 is a circuit diagram showing an example of an integrated circuit having a conventional selector circuit for testing.
Figure 2:
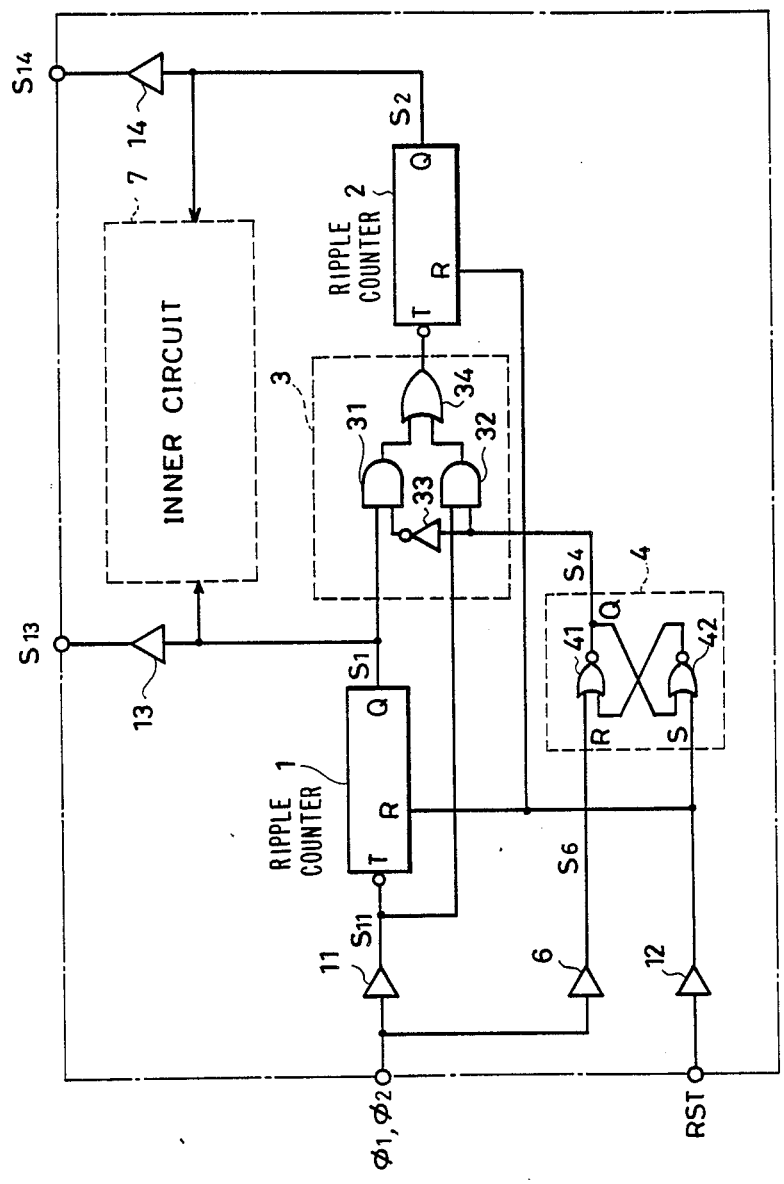
FIG. 2 is a circuit diagram of an integrated circuit comprising an example of an improved selector circuit for testing showing one embodiment of the present invention.

FIG. 2 is a circuit diagram of an integrated circuit (hereinafter referred to as an IC) comprising an example of an improved selector circuit for testing, showing one embodiment of the present invention. Referring to FIG. 2, the circuit is different from the circuit shown in FIG. 1 in that there are provided a buffer 6 for detecting an amplitude level connected to receive external clock signals $\phi1$ and $\phi2$, and a SR flip-flop 4 connected to the output of the buffer 6. The SR flip-flop 4 outputs a signal S4 for controlling the selector circuit 3. Therefore, the terminal for receiving the external test mode signal TM and the buffer 5 are omitted from the circuit shown in FIG. 1. The SR flip-flop 4 has a set input S connected to receive an external reset signal RST through a buffer 12 and a reset input R connected to the output of the buffer 6. In this example, the SR flip-flop 4 comprises two NOR gates 41 and 42. Since other circuit connections are the same as those shown in FIG. 1, its description is omitted.

Figure 3:
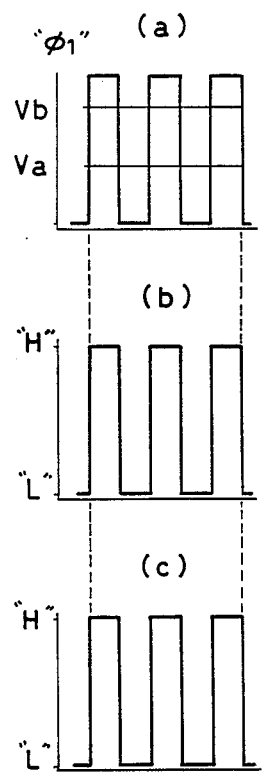
FIGS. 3 and 4 are waveform charts showing the relation between a clock signal inputted from the outside to two buffers shown in FIG. 2 and its output signal.
Figure 4:
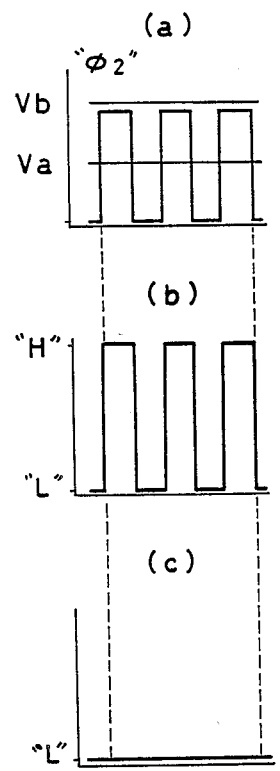

FIGS. 3 and 4 are waveform charts for describing an operational difference between the buffer 6 shown in FIG. 2 and another buffer. The buffer 6 has a threshold voltage Vb higher than that of the other buffers 11 to 14 shown in FIG. 2. On the other hand, the other buffers 11 to 14 have a threshold voltage Va lower than the Vb. As a result, when a clock signal $\phi1$ having an amplitude beyond the voltage Vb as shown in FIG. 3 (a) is applied to the buffers 11 and 6, the buffers 11 and 6 output the same clock signals as shown in FIG. 3 (b). On the other hand, when a clock signal $\phi2$ having amplitude higher than the voltage Va and lower than the voltage Vb is applied to the buffers 11 and 6, the buffer 11 outputs a clock signal shown in FIG. 3 (c) but the buffer 6 does not output a clock signal as shown in FIG. 4 (c).

Figure 5:
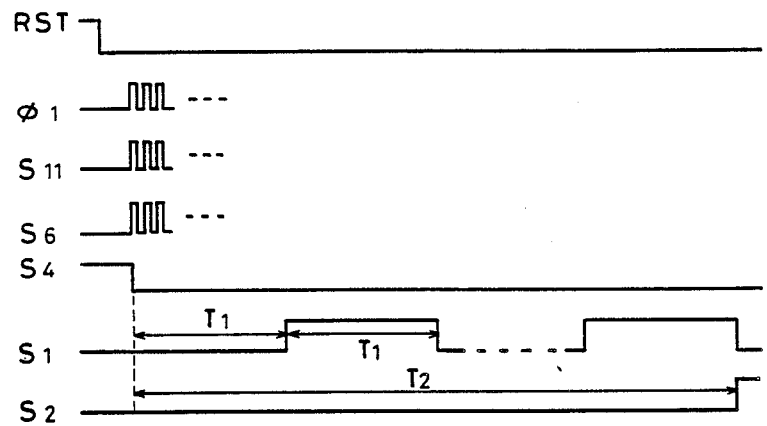
FIG. 5 is a timing chart for describing operation in a normal mode of the selector circuit for testing shown in FIG. 2.

FIG. 5 is a timing chart for describing operation in the normal mode of the selector circuit for testing shown in FIG. 2. Referring to FIGS. 2 and 5, a description is made of operation in the normal mode.

First, initialization is performed. More specifically, the reset signal RST at a high level and the clock signal $\phi1$ at a low level are applied to this IC and the ripple counters 1 and 2 are reset. In addition, the SR flip-flop 4 outputs a signal at a high level. After this initialization, the reset signal RST at a low level is applied. Then, the clock signal $\phi1$ having an amplitude beyond the voltage Vb is applied to this integrated circuit. Therefore, since the buffer 6 outputs a clock signal as shown in FIG. 3 (c), the output signal S4 of the SR flip-flop 4 is changed to a low level. The select circuit 3 connects the output Q of the ripple counter 1 to the toggle input T of the ripple counter 2 in response to the signal S4 at a low level. As a result, a 16-bit counter comprises two counters 1 and 2. Therefore, as shown in FIG. 5, the output signal S1 of the ripple counter 1 is inverted every 128-clock period $T_1$ and the output signal S2 of the counter 2 is inverted every 32,768-clock period $T_2$.

Figure 6:
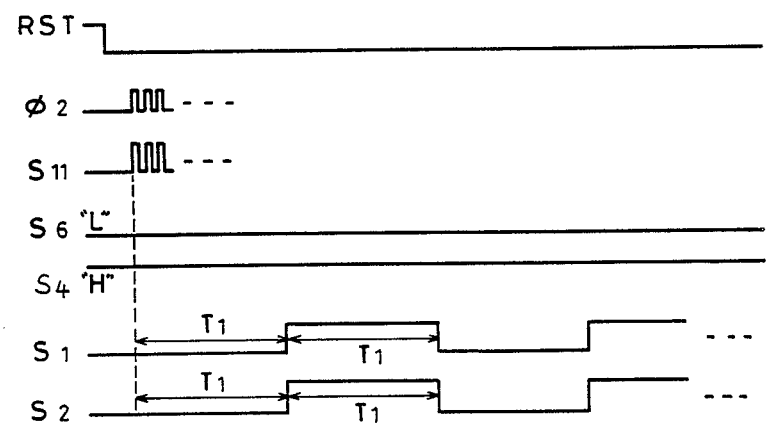
FIG. 6 is a timing chart for describing operation in a test mode of the selector circuit for testing shown in FIG. 2.

FIG. 6 is a timing chart for describing operation in the test mode of the selector circuit for testing shown in FIG. 2. Referring to FIGS. 2 and 6, a description is made of operation in the test mode.

In the test mode, initialization is also performed at first. More specifically, the reset signal RST at a high level and the signal $\phi2$ at a low level are applied to reset the counters 1 and 2. The SR flip-flop 4 outputs a signal S4 at a high level. Thereafter, the rest signal RST is fixed to a low level.

In the test mode, there is applied the clock signal $\phi2$ having an amplitude higher than the voltage Va and lower than the voltage Vb. As shown in FIG. 4 (c), since the threshold voltage Vb is higher than the amplitude of the clock signal $\phi2$, the buffer 6 continues to output a signal S6 at a low level. As a result, both the set input S and the reset input R of the SR flip-flop 4 receive signals at a low level, and the flip-flop continues to remain in the initial state. More specifically, the SR flip-flop 4 outputs a signal S4 at a high level. The select circuit 3 connects the toggle input T of the ripple counter 2 to the output of the buffer 11 in response to the signal S4 at a high level. As a result, an output clock signal S11 of a buffer 11 is applied to the toggle input T of each of the ripple counters 1 and 2. Therefore, since the output signals S1 and S2 of the counters 1 and 2 are inverted every 128-clock period $T_1$, the test for confirming operation can be performed in a short time.

Figure 7:
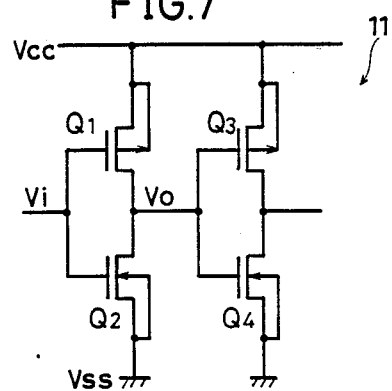
FIGS. 7 and 8 are circuit diagrams showing examples of two buffers shown in FIG. 2.
Figure 8:
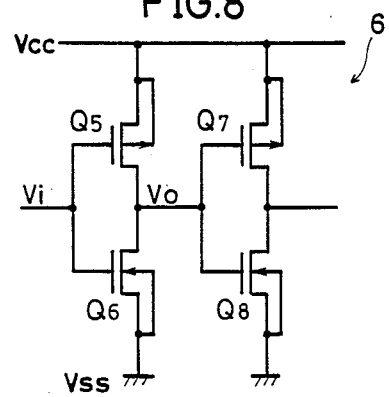

FIGS. 7 and 8 are circuit diagrams showing examples of the buffers 11 and 6 shown in FIG. 2. Referring to FIGS. 7 and 8, the buffer 11 comprises two cascaded CMOS inverters. The buffer 6 also comprises two cascaded CMOS inverters. As described above, the threshold voltage Vb of the buffer 6 is set higher than the threshold voltage Va of the buffer 11. To set the threshold voltage of the buffer 6 higher than the threshold voltage of the buffer 11, it is necessary to set the threshold voltage of a first stage CMOS inverter of the buffer 6 comprising a PMOS transistor Q5 and an N MOS transistor Q6 higher than the threshold voltage of a first CMOS inverter of the buffer 11 comprising a PMOS transistor Q11 and an NMOS transistor Q2.

Figure 9:
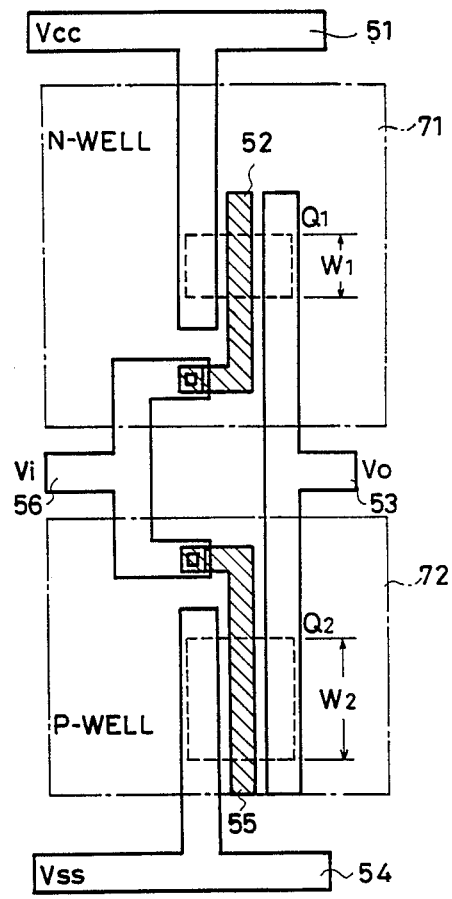
FIGS. 9 and 10 are layouts showing examples of two inverters shown in FIGS. 7 and 8, respectively.
Figure 10:
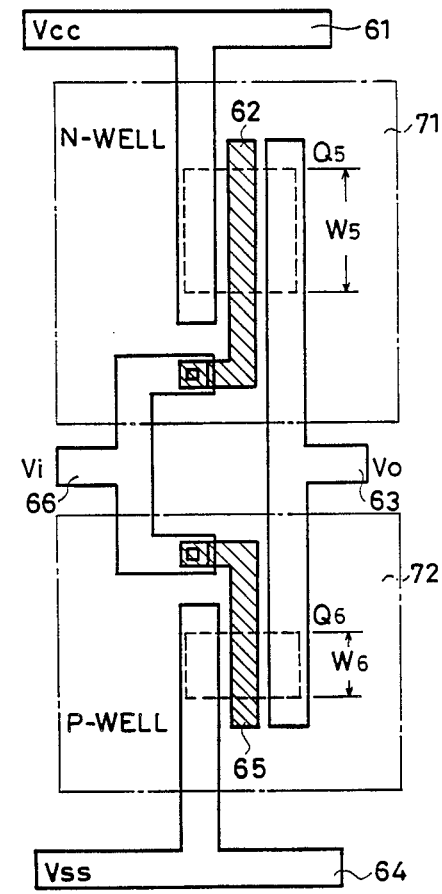

FIGS. 9 and 10 are layouts showing examples of the CMOS inverters shown in FIGS. 7 and 8, respectively. Referring to FIG. 9, the first stage CMOS inverter of the buffer 11 comprises a PMOS transistor Q11 having a channel width W1 formed in an N well 71 and an NMOS transistor Q2 having a channel width W2 formed in a P well 72. The transistor Q1 has its source connected to the power supply Vcc through a polysilicon wiring 51 and its drain connected to a polysilicon wiring 53. An aluminum wiring 52 constitutes the gate of the transistor Q1. The transistor Q2 has its source connected to the ground VVss through a polysilicon wiring 54 and its drain connected to the polysilicon wiring 53. An aluminum wiring 55 constitutes the gate of the transistor Q2.

Referring to FIG. 10, the buffer 6 comprises a PMOS transistor Q5 having a channel width W5 formed in an N well 71 and an NMOS transistor Q6 having a channel width W6 formed in a P well 72. The sources, drains and gates of the transistors Q5 and Q6 are connected in the same way as the case of the buffer 11 shown in FIG. 9.

As can be seen from these figures, since different threshold voltages are set in these two CMOS inverters, the channel widths of the transistors Q1, Q2, Q5 and Q6 are controlled and set in this example. More specifically, the channel width W5 of the transistor Q5 is larger than the channel width W1 of the transistor Q1 and the channel width W6 of the transistor Q6 is smaller than the channel width W2 of the transistor Q2.

In addition to the control of the channel width, the threshold voltages of two CMOS inverters can be controlled by controlling the channel length.

As described above, since the buffer 6 operating in response to the amplitude voltage of the clock signal is provided in the integrated circuit, the designation of the test mode can be performed by differentiating the amplitude of the clock signals. Therefore, a terminal for receiving an external test mode signal is not necessary. As a result, the IC package is prevented from becoming large when operation of the integrated circuit is confirmed.

According to the present invention, in a semiconductor integrated circuit device such as a gate array, the number of input terminals for receiving an external control signal can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device comprising:
    clock signal receiving means for receiving either a first clock signal having an amplitude of a first voltage level or a second clock signal having an amplitude of a second voltage level lower than the first voltage level;
    first circuit means coupled to said clock signal receiving means through a selector circuit means for operating in response to the first or second clock signal;
    detecting means connected to said clock signal receiving means for detecting a voltage level of the amplitude of the clock signal; and
    control signal generating means for generating a control signal to control said selector circuit means in response to said detecting means,
    said selector circuit means operating in response to the control signal from said control signal generating means.

2. A semiconductor integrated circuit device in accordance with claim 1, wherein said detecting means comprises buffer means having a threshold voltage of a level between said first voltage level and said second voltage level.

3. A semiconductor integrated circuit device in accordance with claim 2, wherein said buffer means comprises at least first and second cascaded inverter means,
    said first inverter means having its threshold voltage level set between said first voltage level and the second voltage level.

4. A semiconductor integrated circuit device in accordance with claim 2, further comprising means for receiving a reset signal to reset said control signal generating means,
    said control signal generating means comprising SR flip-flop means having a set input, a reset input and one output, and
    said control signal generating means having its set input connected to said reset signal receiving means and its reset input connected to receive an output signal from said buffer means.

5. A semiconductor integrated circuit device in accordance with claim 3, wherein said first inverter means comprises:
    complementary inverter means comprising a first field effect transistor of one conductivity type and a second field effect transistor of an opposite conductivity type connected in series between the power supply and the ground.

6. A semiconductor integrated circuit device in accordance with claim 1, further comprising second circuit means coupled to said clock signal receiving means for operating in response to said first and said second clock signal,
    said selector circuit means comprising a first input, a second input, and an output, and
    said selector circuit means having said first input connected to receive an output signal from said second circuit means, said second input coupled to said clock signal receiving means and the output connected to said first circuit means.

7. A semiconductor integrated circuit device in accordance with claim 6, wherein said first and second circuit means comprise first and second counter means driven by said first or said second signals.

8. A semiconductor integrated circuit device in accordance with claim 7, wherein said first clock signal is applied to said clock signal receiving means when said first and second counter means are driven in a test mode, and
    said second clock signal is applied to said clock signal receiving means when said first and second counter means are driven in a normal mode.

9. A semiconductor integrated circuit device in accordance with claim 5, wherein said one conductivity type comprises a P type and said opposite conductivity type comprises an N type.

* * * * *